US 7,878,231 B2

(12) United States Patent
Akiyama et al.

(10) Patent No.: US 7,878,231 B2
(45) Date of Patent: Feb. 1, 2011

(54) PIPING WITH COOLANT INLET

(75) Inventors: Tadashi Akiyama, Okazaki (JP);
Tomohiro Oono, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 1316 days.

(21) Appl. No.: 11/410,980

(22) Filed: Apr. 26, 2006

(65) Prior Publication Data
US 2007/0000638 A1    Jan. 4, 2007

(30) Foreign Application Priority Data
Jun. 2, 2005  (JP) .............................. 2005-162672

(51) Int. Cl.
B60H 1/00   (2006.01)
F24F 3/14   (2006.01)
F28B 3/00   (2006.01)
B01D 19/00  (2006.01)
F28F 13/12  (2006.01)
F16L 55/027 (2006.01)

(52) U.S. Cl. ........................... 165/41; 165/60; 165/114; 95/241; 95/260; 95/262; 96/189; 96/206; 138/38; 138/42

(58) Field of Classification Search ............... 165/41, 165/60, 114; 96/189, 206; 95/241, 260, 95/262; 138/42, 38
See application file for complete search history.

(56) References Cited

U.S. PATENT DOCUMENTS
6,375,718 B1 * 4/2002 Blangetti et al. .............. 95/244

FOREIGN PATENT DOCUMENTS
| CN | 1147623 A | 4/1997 |
| JP | U-50-148430 | 12/1975 |
| JP | U-59-127818 | 8/1984 |
| JP | A 2004-82921 | 3/2004 |

OTHER PUBLICATIONS
Feb. 15, 2010 Office Action issued in Japanese patent application No. 2005-162672.

* cited by examiner

Primary Examiner—Frantz F Jules
Assistant Examiner—Travis Ruby
(74) Attorney, Agent, or Firm—Oliff & Berridge, PLC

(57) ABSTRACT

The piping with a coolant inlet is provided with a partition wall within a body part. In the body part, a flow path having a U-turn region changing the flow direction of a coolant by about 180° degrees is defined. Much of the air contained in the coolant returning from a communicating hole to the body part floats up in a region leading to the U-turn region and is released from an inlet to the outside. By using this configuration, it is possible to provide a piping with a coolant inlet having a structure capable of efficiently releasing the air generated in a coolant circulation path.

4 Claims, 4 Drawing Sheets

PIPING WITH COOLANT INLET

This nonprovisional application is based on Japanese Patent Application No. 2005-162672 filed with the Japan Patent Office on Jun. 2, 2005, the entire contents of which are hereby incorporated by reference.

BACKGROUND OF THE INVENTION

1. Field of the Invention

The present invention relates to a structure of a piping with a coolant inlet.

2. Description of the Background Art

In recent years, in a hybrid vehicle and the like, an economy running system (also called an idling stop system and the like) has been developed, which automatically stops an engine when the vehicle stops at an intersection, and restarts the engine upon an operation by a driver to restart the vehicle.

In this system, it is necessary to supply power to auxiliary machinery (an air conditioner, a headlight, an audio system, and so on) and to a motor generator operative to restart an engine. Accordingly, two power sources having different voltages (a 12V battery, a 36V battery and a 200V battery or more etc.) and a PCU (Power Control Unit) including an inverter and a converter are mounted. The PCU is connected to these two power sources and also to the motor generator installed on the side of the engine via a power cable.

The PCU is cooled down by a coolant in order to prevent an increase in temperature caused by an electric circuit therewithin. This coolant for the PCU provides a cooling system having a coolant circulation path in which heat exchange with the outside air is performed by an electric water pump and a radiator, which system is provided separately from the coolant for the engine.

Not only in the cooling system employed in the above-described PCU, but also in the above-described cooling system generally using a coolant, a piping with a coolant inlet is provided in the circulation path as a region for storing the coolant and to be replenished with it periodically. This piping with the coolant inlet that is in the shape of a tank enabling a temporary accumulation of the coolant is provided with a feed port for feeding the coolant in the tank to the coolant circulation path, a return port for returning the coolant circulated through the coolant circulation path into the tank, and an inlet for injecting the coolant into the tank. One example of the coolant circulation path using such piping with the coolant inlet is disclosed in Japanese Patent Laying-Open No. 2004-082921.

In the coolant circulation path using the piping with the coolant inlet having the above-described configuration, however, there is a problem of air mixed into or generated in the path when the electrical water pump is used to circulate the coolant. In particular, in a vehicle and the like, space for placing the coolant circulation path is often limited. Thus, with the water pump capacity maintained, the coolant circulation path and the piping with the coolant inlet are reduced in size, and as a result, the coolant circulation path becomes complicated. This tends to increase the possibility of mixing the air into the coolant circulation path.

The mixing of the air into the cooling path causes problems such as unusual noise in the water pump, a decrease in durability of the water pump, and shortening of intervals between operation cycles for removing the air in the cooling path. Furthermore, it is also suggested that the coolant circulation path is completely sealed so as to avoid the mixing of the air. However, in this case, it is known that the piping with the coolant inlet should be increased in size, which goes against the need for reducing the size of the piping with the coolant inlet. In addition, it is also difficult to consider modifications to the coolant circulation path in the light of the arrangement of other equipment.

SUMMARY OF THE INVENTION

A problem to be solved by the present invention is in that the mixing of air into a cooling system tends to increase because of a reduction in size of a coolant circulation path and a piping with a coolant inlet, and a resulting complicated coolant circulation path when using the coolant circulation path cooling a cooling object by circulating a coolant. Therefore, an object of the present invention is to provide a piping with a coolant inlet having a structure which is capable of efficiently removing the air generated in the coolant circulation path.

The piping with the coolant inlet according to the present invention, which is incorporated in a coolant circulation path circulating a coolant for cooling an apparatus to be cooled, includes a reservoir for storing the coolant, a feed port provided in the reservoir and for feeding the coolant in the reservoir to the coolant circulation path, a return port provided in the reservoir and for returning the coolant circulated through the coolant circulation path into the reservoir, a partition wall provided in the reservoir to define a flow path having a U-turn region changing the flow direction of the coolant by about 180 degrees such that the feed port is arranged on one end of the flow path and the return port is arranged on the other end of the flow path, and an inlet exposing an end portion of the partition wall facing the U-turn region and a part of the U-turn region, and for injecting the coolant into the reservoir.

According to the piping with the coolant inlet of the present invention, the coolant that returns from the return port into the reservoir is supposed to flow along the U-turn shaped flow path formed within the reservoir toward the feed port. First, the coolant returning from the return port into the reservoir is supposed to contain a large amount of air. Much of the air contained in the coolant returning from the return port into the reservoir will float up in a region leading to the U-turn region. Furthermore, because the end portion of the partition wall facing the U-turn region and a part of the U-turn region are exposed at the inlet, the air floating up passes through this inlet further upwardly to be released outside of the reservoir. The coolant with the air removed will then flow toward the feed port and circulate through the coolant circulation path.

Thus, according to the piping with the coolant inlet in accordance with the present invention, it is possible to efficiently remove the air generated within the coolant circulation path, and also possible to prevent the mixing of the air into the coolant circulation path even in the case where downsizing of the coolant circulation path and the piping with the coolant inlet complicates the structure of the coolant circulation path.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
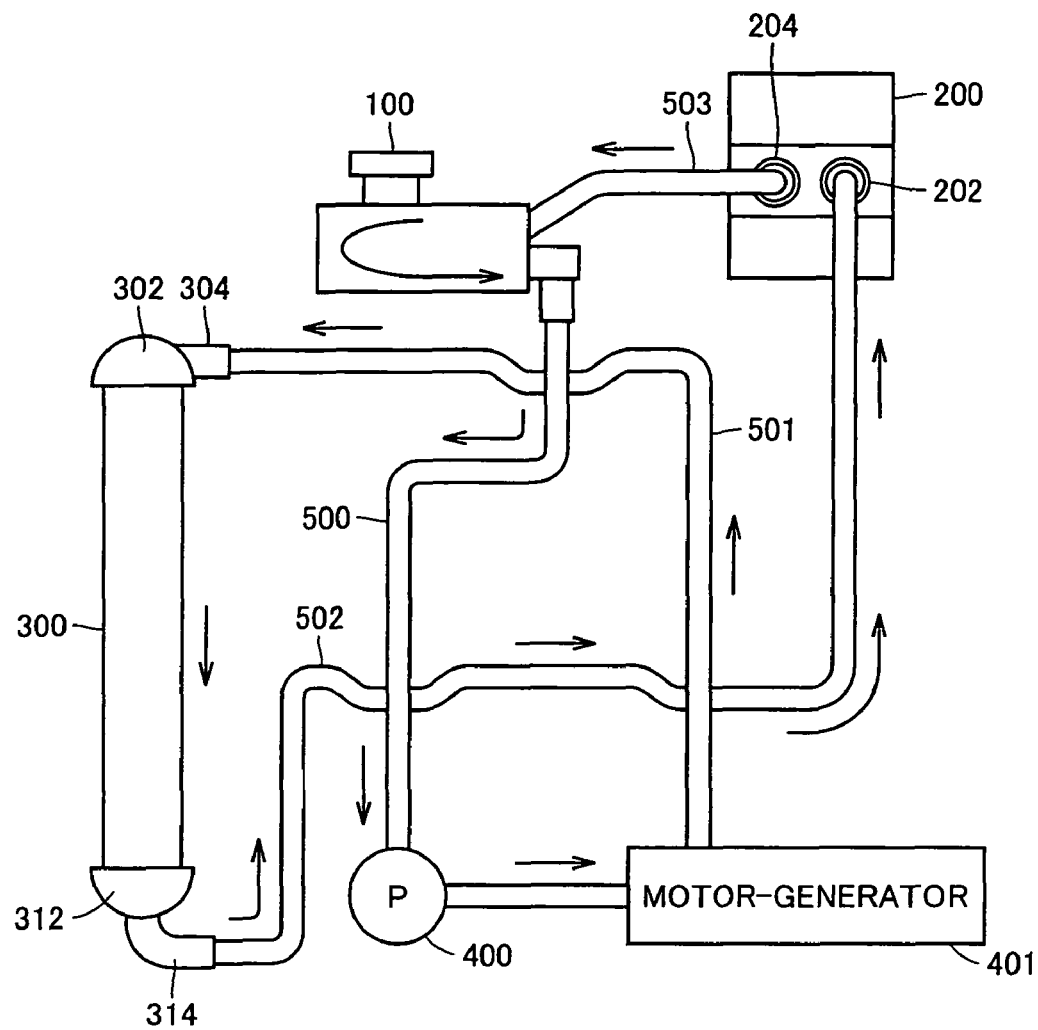
FIG. 1 is a diagram illustrating a configuration of a PCU cooling system of a vehicle, which employs a piping with a coolant inlet according to a first embodiment of the present invention.
Figure 2:
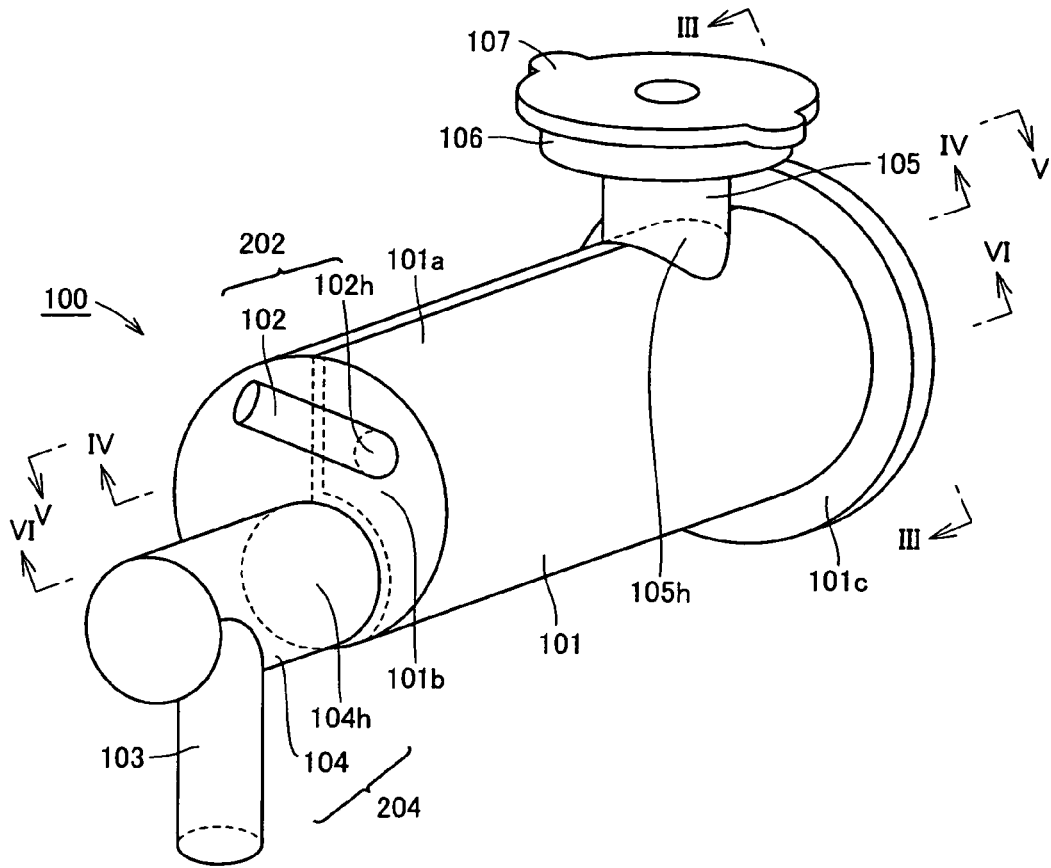
FIG. 2 is a general perspective view showing the piping with the coolant inlet in the first embodiment of the present invention.

A piping with a coolant inlet in each embodiment according to the present invention will be hereinafter described with reference to the accompanying drawings. The same or corresponding components in each embodiment are designated by the same reference characters, and description thereof will not be repeated. The following embodiments will illustrates the case, as an application example of the present invention, in which a piping with a coolant inlet according to the present invention is applied to a coolant circulation path used for cooling a PCU of a vehicle. However, the present invention is not limited to the coolant circulation path for the PCU of the vehicle. It is possible to apply the present invention to a coolant circulation path widely employed for similar cooling objects.

First Embodiment

A piping 100 with a coolant inlet in the first embodiment will be described with reference to FIGS. 1 to 5.

Firstly, referring to FIG. 1, a cooling system for a PCU 200 will be described. This cooling system includes a piping 100 with a coolant inlet, a radiator 300 for PCU 200 provided in the front of a vehicle, an electric water pump 400 and a motor-generator 401 provided below PCU 200, PCU 200 which is an apparatus to be cooled, and pipes 500, 501, 502, 503 for connecting these elements and circulating a coolant which is a coolant.

A coolant return port 202 of PCU 200 has pipe 502 connected, which is connected to a lower tank pipe 314 of radiator 300. The coolant injected from a lower tank 312 is fed to PCU 200. This radiator 300 is of a down flow type. A coolant feed port 204 of PCU 200 has pipe 503 connected, which is coupled to a coolant return port of piping 100 with the coolant inlet. A coolant feed port of piping 100 with the coolant inlet has pipe 500 connected, which is coupled to electric water pump 400 and motor-generator 401. Motor-generator 401 has pipe 501 connected, which is coupled to an upper tank pipe 304 of radiator 300. The coolant is fed through this upper tank pipe 304 to an upper tank 302.

Referring to FIGS. 2 to 6, a specific configuration of piping 100 with the coolant inlet will now be described. This piping 100 with the coolant inlet has a body part 101 serving as a reservoir for storing the coolant. This body part 101, which is in an approximately cylindrical shape, includes a cylindrical drum part 101a, a circular side wall 101b provided on one end of drum part 101a to have the same circumference as drum part 101a, a side wall 101c in the shape of a circular flange provided on the other end of drum part 101a to protrude radially outward from the circumference of drum part 101a.

On side wall 101b of body part 101, a communicating hole 102h leading into body part 101 is coupled to a return pipe 102 so as to configure a coolant return port 202. Furthermore, on this side wall 101b, a communicating hole 104h leading into body part 101 is coupled to a feed pipe 104 so as to configure a coolant feed port 204. In addition, feed pipe 104 has a branch pipe 103 coupled for returning the flow of the coolant fed from feed pipe 104.

Communicating hole 102h opens in side wall 101b at a portion lower than the center thereof. Return pipe 102 is attached to side wall 101b such that it is inclined downward with respect to the horizontal plane. Thus, as can be clearly seen in the cross-sectional view in FIG. 4, return pipe 102 is attached to side wall 101b such that it is inclined downward.

In body part 101, a partition wall 110 is provided so as to partition communicating hole 102h and communicating hole 104h. One end of this partition wall 110 is connected to the inner surface of side wall 101b so as to separate communicating hole 102h from communicating hole 104h. Upper and lower ends of partition wall 110 are also connected to the inner surface of drum part 101a so as to divide the inner space of drum part 101a into the left and right sides. The other end of partition wall 110 has an end portion 101t that does not touch side wall 101c so as to form a U-turn region 110U (see FIG. 6) on the side of side wall 101c which is the other end of body part 101. In this way, partition wall 110 is provided in body part 101 to thereby define a flow path R1 having U-turn region 110U for changing the flow direction of the coolant by about 180 degrees in piping 100 with the coolant inlet, with coolant feed port 204 arranged on one end of flow path R1 and coolant return port 202 arranged on the other end of flow path R1.

Furthermore, on the upper side of drum part 101a in the vicinity of side wall 101c, an inlet 105h is provided for injecting the coolant into body part 101. This inlet 105h has an injection pipe 105 and a wide-mouthed pipe 106 coupled thereto. Wide-mouthed pipe 106 has a cap 107 attached detachably for closing wide-mouthed pipe 106. Inlet 105h is positioned so that end portion 110t of partition wall 110 facing U-turn region 110U and a part of U-turn region 110U in flow path R1 are exposed. In addition, an upper end of end portion 110t of partition wall 110 is provided with a stepped part 110a, which is recessed from end portion 110t toward coolant return port 202.

Figure 4:
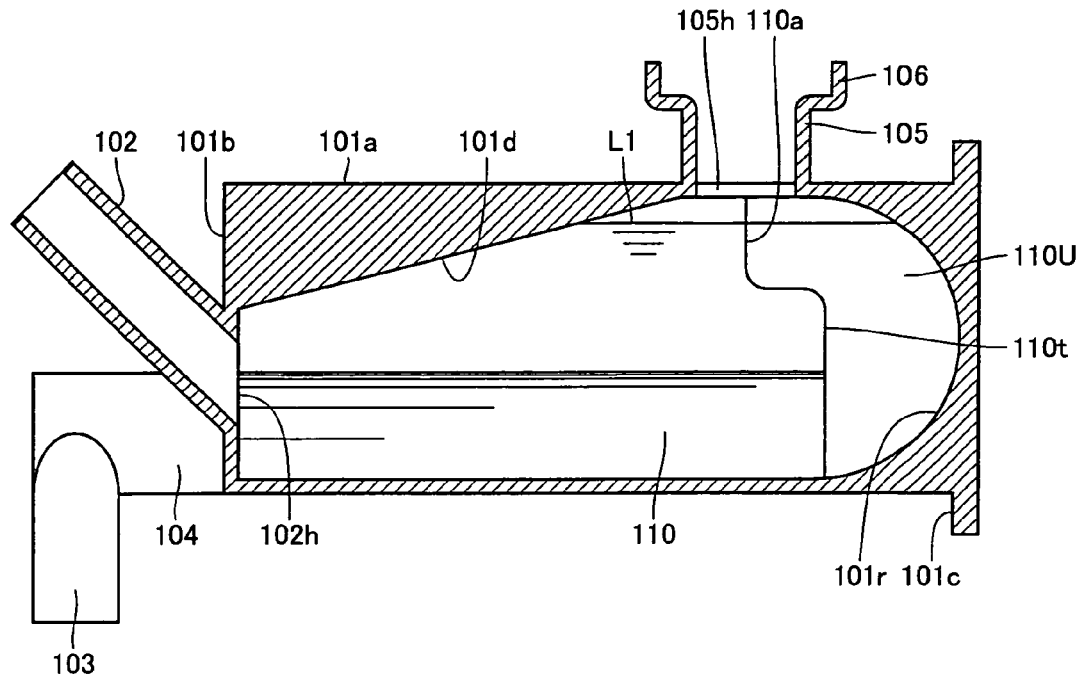
FIG. 4 is a cross-sectional view taken along an arrow line IV-IV in FIG. 2.
Figure 5:
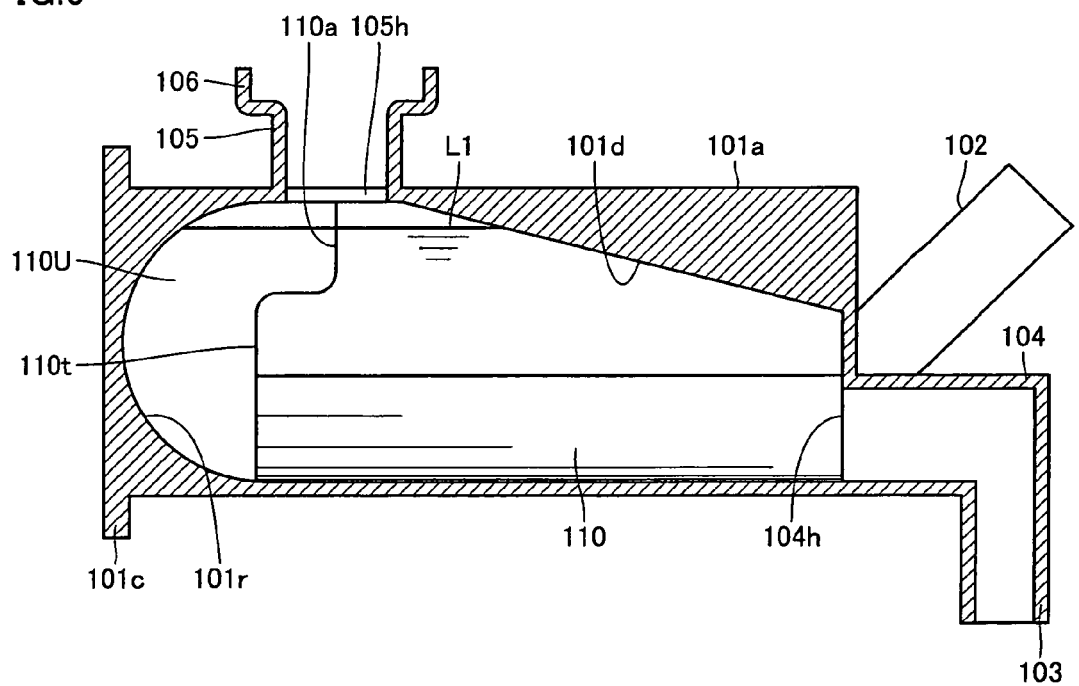
FIG. 5 is a cross-sectional view taken along an arrow line V-V in FIG. 2.
Figure 6:
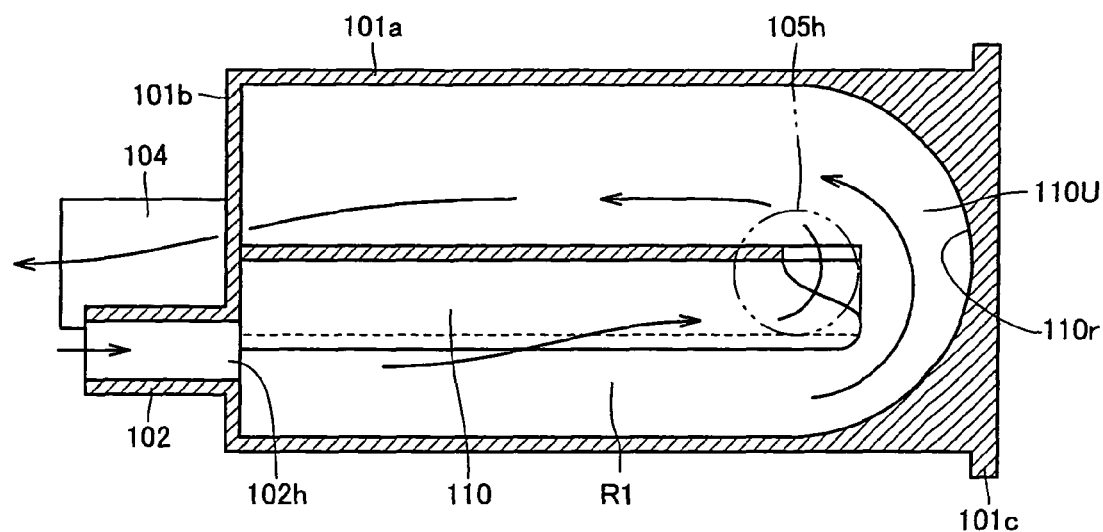
FIG. 6 is a cross-sectional view taken along an arrow line VI-VI in FIG. 2.

As can be clearly seen in FIGS. 4 to 6, an inner surface wall of side wall 101c to which end portion 110t of partition wall 110 is opposed is formed in a concave shape 101r, and, in the present embodiment, by way of example, formed in a hemispherical shape. Further, as can be clearly seen in FIGS. 4 and 5, on the upper side of flow path R1, an inclined surface 101d inclined upward to inlet 105 is provided.

Figure 3:
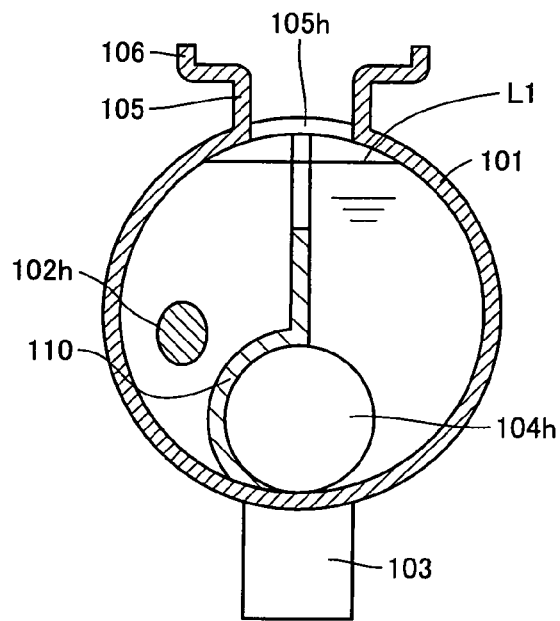
FIG. 3 is a cross-sectional view taken along an arrow line III-III in FIG. 2.

According to piping 100 with the coolant inlet having the above-described configuration, firstly, as shown in FIGS. 3 to 5, the coolant is stored to the level designated by L1. In circulating the coolant, as shown by an arrow in FIG. 6, the coolant which returns from return pipe 102 and communicating hole 102h into body part 101 will flow along U-turn shaped flow path R1 formed within body part 101 toward communicating hole 104h and feed pipe 104.

It is assumed that a large amount of air is contained in the coolant which returns from return pipe 102 and communicating hole 102h into body part 101. However, much of the air contained in the coolant returning from communicating hole 102h into body part 101 will float up in a region leading to U-turn region 110U. Furthermore, because end portion 110t of the partition wall facing U-turn region 110 and the part of U-turn region 110U are exposed at inlet 105h, the air floating up will pass through this inlet 105h further upwardly to be released outside of the tank. The coolant from which the air is removed will thereafter flow toward the feed port and circulate through the coolant circulation path.

As a result, according to piping 100 with the coolant inlet in the present embodiment, it is possible to efficiently remove the air generated within the coolant circulation path to the outside, and also possible to prevent the mixing of the air into the coolant circulation path even in the case where downsizing of the coolant circulation path and the piping with the coolant inlet complicates the structure of the coolant circulation path.

On the upper side of flow path R1, inclined surface 101d inclined upward to inlet 105 is provided. This promotes the flow of the air floating up toward inlet 105. If less amount of air is generated, it is possible to sufficiently release the air from inlet 105, without providing inclined surface 101d, owing to the configuration of the coolant system.

Furthermore, communicating hole 102h opens in side wall 101b at a portion lower than the center thereof, and return pipe 102 is attached to side wall 101b such that it is inclined downward with respect to the horizontal plane. This allows the coolant returning into pipe 101 to join the coolant stored in pipe 101 to thereby prevent the generation of the air caused by the impact of the coolant. However, in the case where the amount of the air may not cause any problem, the manners of providing communicating hole 102h and attaching return pipe 102 to side wall 101b are not particularly limited.

In addition, in order to improve the flow of the coolant through U-turn region 110U and avoid the generation of the air caused by the impact of the coolant on side wall 101c, the inner surface wall of side wall 101c is formed in a hemispherical shape. However, in the case where the flow velocity of the coolant flowing through flow path R1 is relatively low and the generation of the air caused by the impact of the coolant on side wall 101c does not cause any problem, the inner surface wall of side wall 101c may be flat.

Second Embodiment

Figure 7:
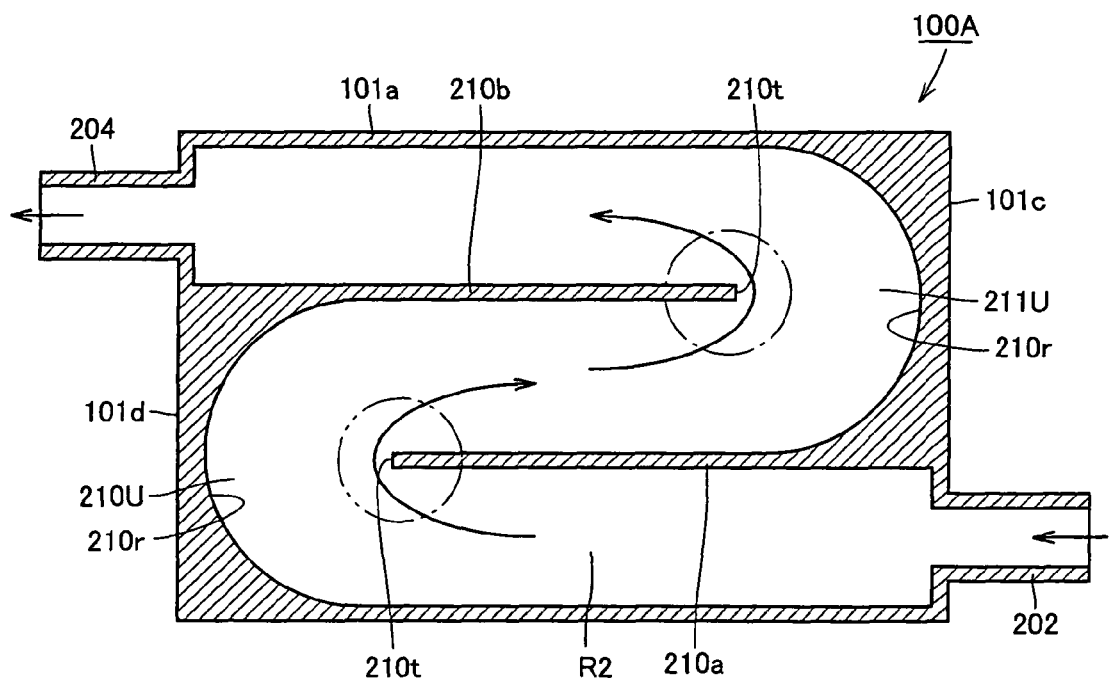
FIG. 7 is a cross-sectional view corresponding to the arrow line VI-VI in FIG. 2, showing a piping with a coolant inlet according to a second embodiment of the present invention.

A piping 100A with coolant inlets in the second embodiment will now be described with reference to FIG. 7.

According to piping 100 with the coolant inlet in the above-described first embodiment, in flow path R1 within body part 101, partition wall 110 is provided so as to form one U-turn region 110U. However, in a flow path R2 within body part 101 of piping 100A with the coolant inlets in the present embodiment, partition walls 210a, 210b are provided so as to form two U-turn regions 210U, 211U.

Specifically, partition wall 210a connected to side wall 101c and provided so as to extend toward side wall 101b, and partition wall 210b connected to side wall 101b and provided so as to extend toward side wall 101c are placed alternately. Flow path R2 having two U-turn regions 210U, 211U each changing the flow direction of the coolant by about 180 degrees is defined, coolant feed port 204 is placed on one end of flow path R2, and coolant return port 202 is placed on the other end of flow path R2. Therefore, whereas in the above-described first embodiment, coolant return port 202 and coolant feed port 204 are placed on the same end face of body part 101, in the present embodiment, coolant return port 202 and coolant feed port 204 are respectively placed on the opposed end faces of body part 101.

Furthermore, as to inlet 105h for injecting the coolant into body part 101 provided on the upper side of drum part 101a in the vicinity of side wall 101c, in the present embodiment, two inlets 105h may be provided at two positions such that each end portion 210t of partition walls 210a, 210b respectively facing U-turn regions 210U, 211U and each part of U-turn-regions 210U, 211U in flow path R2 are exposed. In addition, the inner surface walls of side walls 101b, 101c to which respective ends 210t of partition walls 210a, 210b are opposed are formed in a concave shape 210r, and formed in a hemispherical shape also in the present embodiment. For the other parts of this embodiment, it is possible to employ a configuration similar to the above-described first embodiment.

Piping 100A with the coolant inlets having the above-described configuration can achieve the same effect as in the above-described piping 100 with the coolant inlet. Also, piping 100A with the coolant inlets in the present embodiment allows long flow path R2 to be provided to create two inlets 105h for releasing the air to the outside. Therefore, it is possible to effectively remove the air from the coolant.

As can be clearly seen from pipings with coolant inlets 100, 100A shown in the first and second embodiments described above, the nature of the present invention is in that a U-turn region for changing the flow direction of the coolant by about 180° degrees is provided at the flow path in the tank to release the air from this region to the outside. Therefore, the number of the partition walls can be chosen based on the configuration of the present invention and is not limited to the above-described embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A piping with a coolant inlet incorporated in a coolant circulation path configured to circulate a coolant for cooling a power control unit to be cooled in a vehicle, comprising:
    a reservoir configured to store said coolant;
    a feed port provided in said reservoir and configured to feed the coolant in said reservoir into said coolant circulation path;
    a return port provided in said reservoir and configured to return said coolant circulated through said coolant circulation path into said reservoir;
    a partition wall provided in said reservoir to define a flow path having a U-turn region changing horizontally in a horizontal plane a flow direction of said coolant by about 180° degrees such that said feed port is arranged on one end of said flow path and said return port is arranged on the other end of said flow path; and
    an inlet exposing an end portion of said partition wall facing said U-turn region and a part of said U-turn region, and configured to inject the coolant into said reservoir, the upper side of said flow path being provided with an inclined surface inclined upward to said inlet.

2. The piping with the coolant inlet according to claim 1, wherein
    an inner surface wall of said reservoir to which the end portion of said partition wall is opposed is formed in a concave shape.

3. The piping with the coolant inlet according to claim 1, wherein
    said return port is attached to said reservoir such that said return port is inclined downward with respect to the horizontal plane.

4. The piping with the coolant inlet according to claim 1, wherein said reservoir is in an approximately cylindrical shape, said feed port and said return port are provided on one end of said reservoir, said partition wall provided within said reservoir has one end connected to an inner wall of said reservoir so as to partition said feed port and said return port on one end of said reservoir, and has the other end defining said end portion so as to form said U-turn region on the other end of said reservoir.

* * * * *